US012646694B2

(12) United States Patent
Lee et al.

(10) Patent No.: US 12,646,694 B2
(45) Date of Patent: Jun. 2, 2026

(54) CONTINUOUS PLASMA PROCESSING SYSTEM WITH ADJUSTABLE ELECTRODE

(71) Applicant: UVAT TECHNOLOGY CO., LTD., Taoyuan City (TW)

(72) Inventors: Yuan-Chi Lee, Taoyuan City (TW); Pin-Chun Liu, Taoyuan City (TW); Chun-Chieh Yang, Taoyuan City (TW); Ming-Chan Tsai, Taoyuan City (TW); Chih-Ming Lu, Taoyuan City (TW)

(73) Assignee: UVAT TECHNOLOGY CO., LTD., Taoyuan City (TW)

( * ) Notice: Subject to any disclaimer, the term of this patent is extended or adjusted under 35 U.S.C. 154(b) by 480 days.

(21) Appl. No.: 18/380,220

(22) Filed: Oct. 16, 2023

(65) Prior Publication Data

US 2025/0125127 A1     Apr. 17, 2025

(51) Int. Cl.
*H01J 37/32* (2006.01)

(52) U.S. Cl.
CPC .. *H01J 37/32761* (2013.01); *H01J 37/32568* (2013.01); *H01J 37/32715* (2013.01)

(58) Field of Classification Search
CPC ........... H01J 37/32091; H01J 37/32568; H01J 37/32577; H01J 37/32605; H01J 37/32715; H01J 37/32761
See application file for complete search history.

(56) References Cited

U.S. PATENT DOCUMENTS

| | | | | | |
|---|---|---|---|---|---|
| 6,035,804 | A | * | 3/2000 | Arami | H10P 72/0462 |
| | | | | | 118/728 |
| 2009/0008035 | A1 | * | 1/2009 | Iwai | H01J 37/32082 |
| | | | | | 156/345.47 |
| 2010/0196626 | A1 | * | 8/2010 | Choi | C23C 16/5096 |
| | | | | | 427/569 |
| 2022/0093436 | A1 | * | 3/2022 | Kustra | H01J 37/32091 |

FOREIGN PATENT DOCUMENTS

CN     113066745 A  *  7/2021  .......... H10P 72/3314

* cited by examiner

*Primary Examiner* — Benjamin Kendall
(74) *Attorney, Agent, or Firm* — WPAT, PC

(57)          ABSTRACT

A continuous plasma processing system with adjustable electrode includes a frame shape carrier plate for holding a to-be-processed object, a loading chamber for inputting the to-be-processed object, a processing chamber, and an unloading chamber for outputting the finished object. The processing chamber has a first electrode, a second electrode, and a moving device controlling the second electrode to move between an electrically disconnected position and an electrically conducted position. When the second electrode is away from the first electrode and does not contact the to-be-processed object, the second electrode is at the electrically disconnected position. When the second electrode moves toward the first electrode to push the to-be-processed object to leave the frame shape carrier plate, the second electrode is at the electrically conducted position. The plasma electric field is prevented from being affected by particles on the carrier plate.

11 Claims, 6 Drawing Sheets

CONTINUOUS PLASMA PROCESSING SYSTEM WITH ADJUSTABLE ELECTRODE

BACKGROUND OF THE INVENTION

1. Field of the Invention

The present invention relates to plasma processing techniques, and more particularly, to a continuous plasma processing system with adjustable electrode.

2. Description of the Related Art

Plasma process is one of widely used technologies in semiconductor processing field. However, particles generated by the plasma process are not only deposited on the surface of the to-be-processed object, but also attached to the surface of the carrier plate holding the to-be-processed object. When the particles deposited on the carrier plate reach a certain amount, the carrier plate will be connected with the to-be-processed object, such that the subsequent process will be affected.

For example, when the carrier plate is covered with sputtered particles to generate electrical conductivity thereon, the carrier plate is electrically conducted with the to-be-processed object, whereby the effect of electric field of the plasma process is affected. As a result, the agglomeration of plasma particles is easily dispersed or diffused, reducing the efficiency of the plasma process. Also, the processing machine is easily damaged due to a short circuit, thereby affecting the yield of the processed objects. In addition, since the carrier plate is reusable, the particles generated on the carrier plate by the plasma process need to be scraped or cleaned to avoid contamination during the subsequent plasma process, failing to meet the convenience of usage.

SUMMARY OF THE INVENTION

The present invention aims at resolving the effect caused upon the electric field of the plasma due to the particles attached thereon that are generated by the plasma process.

For achieving the aforementioned objectives, the present invention provides a continuous plasma processing system with adjustable electrode, comprising a frame shape carrier plate, a loading chamber, a processing chamber, and an unloading chamber. The frame shape carrier is configured to hold a to-be-processed object. The loading chamber is configured to input the to-be-processed object. The processing chamber is in communication with the loading chamber and is configured to receive the to-be-processed object and carry out the plasma process on the to-be-processed object. The processing chamber comprises a first electrode, a second electrode, and a moving device. The first electrode and the second electrode are disposed on two opposite ends of the processing chamber to form a processing space. The moving device is connected with the second electrode. When the frame shape carrier plate moves to the processing space, the moving device controls the second electrode to move between an electrically disconnected position and an electrically conducted position. When the second electrode is away from the first electrode and does not contact the to-be-processed object, the second electrode is at the electrically disconnected position. When the second electrode moves toward the first electrode and passes through the frame shape carrier plate to push the to-be-processed object to leave the frame shape carrier plate, the second electrode is at the electrically conducted position. The unloading chamber is in communication with the processing chamber and is configured to receive and output the finished to-be-processed object.

With such configuration, the continuous plasma processing system with adjustable electrode applies the moving device to control the second electrode to move toward the first electrode, such that the second electrode passes through the frame shape carrier plate and pushes up the to-be-processed object, whereby a non-plasma area is generated between the frame shape carrier plate and the to-be-processed object, avoiding the effect caused on the plasma process by the conductivity between the frame shape carrier plate and the to-be-processed object, thereby preventing the reduction of processing efficiency, damage of the machine, and the poor yield.

DETAILED DESCRIPTION OF THE INVENTION

Figure 1:
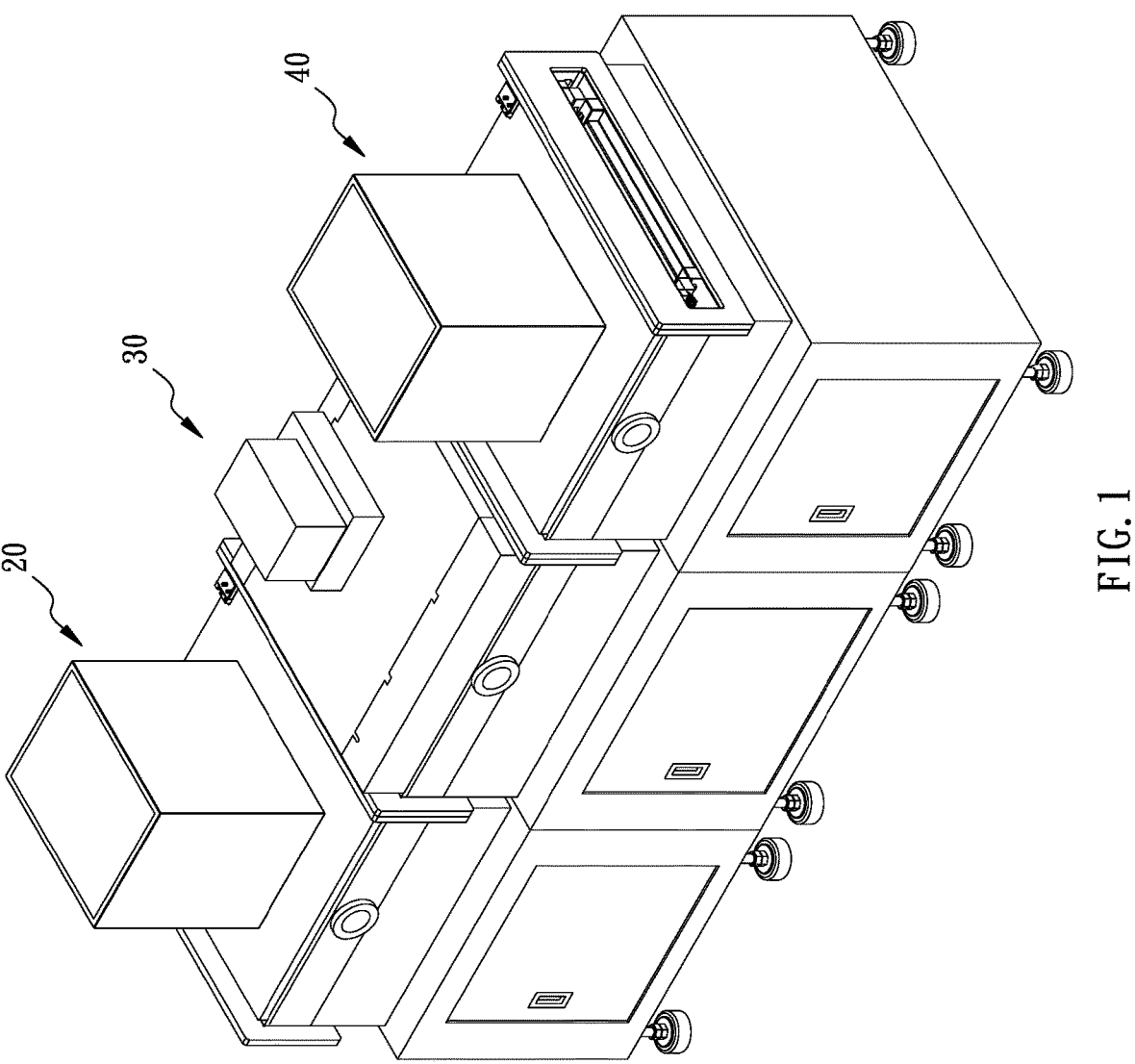
FIG. 1 is a perspective view of the plasma processing system in accordance with an embodiment of the present invention.

The aforementioned and further advantages and features of the present invention will be understood by reference to the description of the preferred embodiment in conjunction with the accompanying drawings where the components are illustrated based on a proportion for explanation but not subject to the actual component proportion.

Referring to FIG. 1 to FIG. 6b, the present invention provides a continuous plasma processing system 100 with adjustable electrode, comprising a frame shape carrier plate 10, a loading chamber 20, a processing chamber 30, an unloading chamber 40, and a conveying device 50.

In the embodiment, the loading chamber 20, the processing chamber 30, and the unloading chamber 40 are orderly disposed and arranged in communication (as shown by FIG. 1), wherein the conveying device 50 is simultaneously disposed in the loading chamber 20, the processing chamber 30, and the unloading chamber 40. The loading chamber 20 is configured to input a to-be-processed object 1. The processing chamber 30 is configured to receive the to-be-processed object 1 and carry out a plasma process on the to-be-processed object 1. The unloading chamber 40 is configured to receive and output the finished to-be-processed object 1. The conveying device 50 is configured to facilitate a horizontal movement of the frame shape carrier plate 10 in the loading chamber 20, the processing chamber 30, and the unloading chamber 40.

The frame shape carrier plate 10 is applied for holding the to-be-processed object 1. The frame shape carrier 10 is placed on the conveying device 50. With the conveying operation of the conveying device 50, the frame shape carrier plate 10 is driven to horizontally move the to-be-processed object 1 from the loading chamber 20 into the processing chamber 30 toward the unloading chamber 40. In the embodiment, the frame shape carrier plate 10 is formed of a conductive material.

Figure 2:
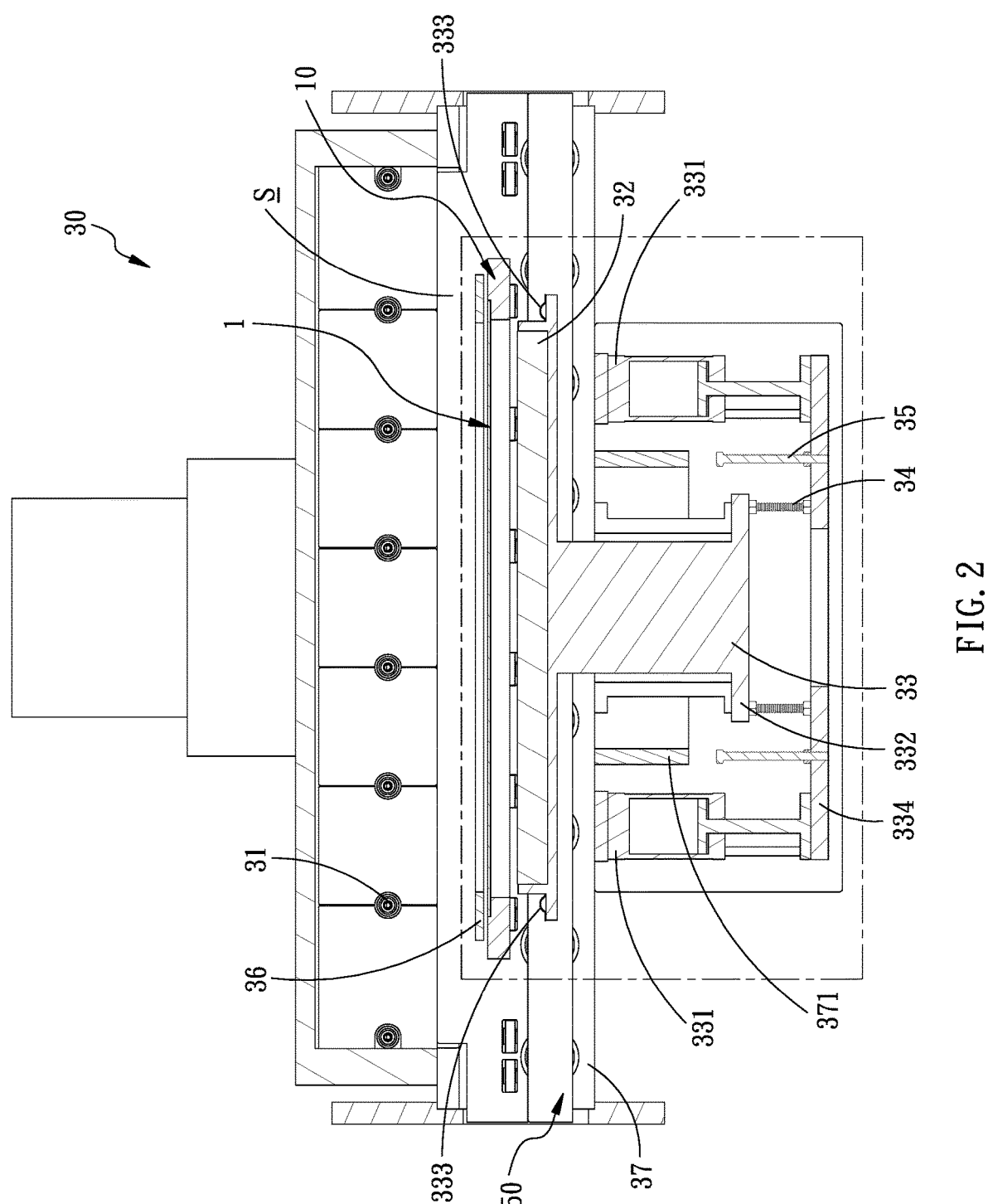
FIG. 2 is a sectional view of the processing chamber in accordance with an embodiment of the present invention.

The processing chamber 30 comprises a first electrode 31, a second electrode 32, and a moving device 33. As shown by FIG. 2, the first electrode 31 and the second electrode 32 are disposed on two opposite ends in the processing chamber 30 to form a processing space S. The moving device 33 is connected with the second electrode 32. The first electrode 31 and the second electrode 32 are disposed in a vertical arrangement in the processing chamber 30.

In the embodiment, the first electrode 31 and the second electrode 32 are coupled with a radio frequency power source, respectively, so that each frequency power source provides the radio frequency energy to the first electrode 31 and the second electrode 32 to generate the plasma, thereby carrying out the plasma process on the to-be-processed object 1. Alternatively, an arrangement with one of the first electrode 31 and the second electrode 32 being coupled with the power source and the other one being grounded allows the generation of the electric field in the processing chamber 30 for the plasma process as well.

Figure 3:
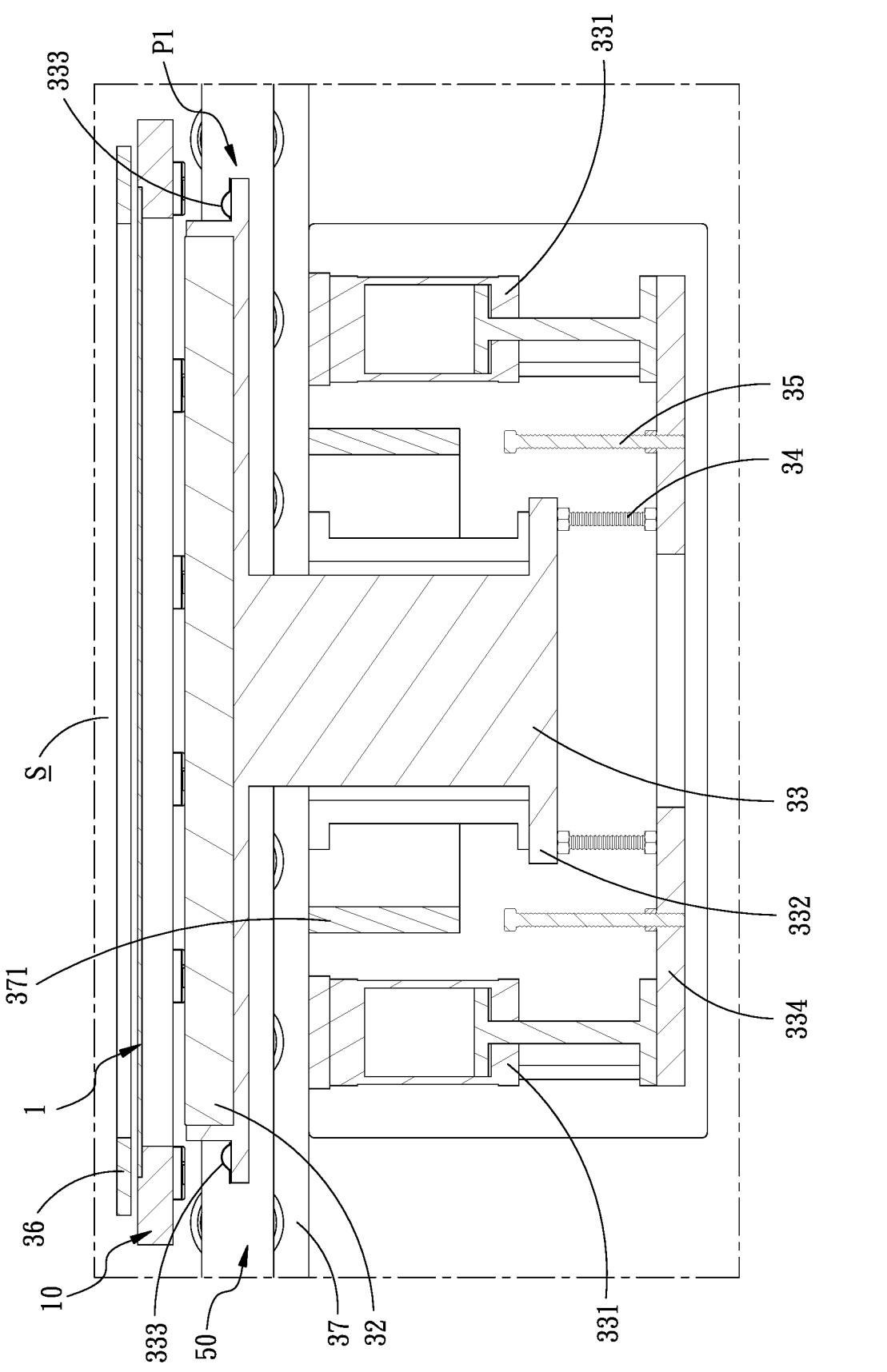
FIG. 3 is a partially enlarged view of FIG. 2, illustrating the second electrode at the electrically disconnected position.
Figure 4:
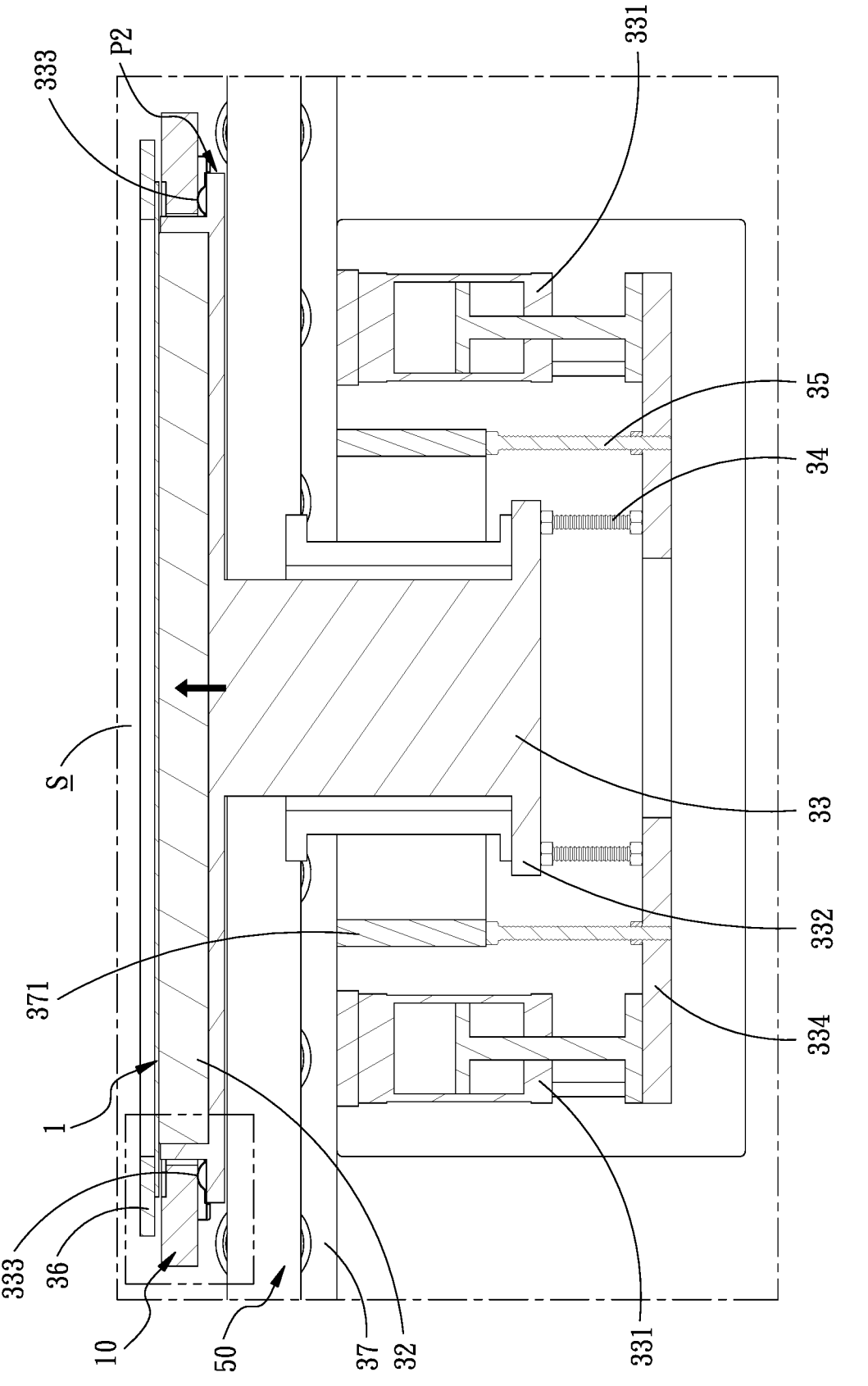
FIG. 4 is a partially enlarged view of FIG. 2, illustrating the second electrode at the electrically conducted position.

In the embodiment, when the frame shape carrier plate 10 moves into the processing space S, the moving device 33 controls the second electrode 32 to move between an electrically disconnected position P1 and an electrically conducted position P2, as shown by FIG. 2 and FIG. 3. When the second electrode 32 is away from the first electrode 31 and does not contact the to-be-processed object 1, the second electrode 32 is at the electrically disconnected position P1. As shown by FIG. 2 and FIG. 4, when the second electrode 32 moves toward the first electrode 31 and passes through the frame shape carrier plate 10 to push the to-be-processed object 1 up to leave the frame shape carrier plate 10, the second electrode 32 is at the electrically conducted position P2. Notably, in the present invention, the first electrode 31 and the second electrode 32 taken as the embodiment are disposed in a vertical arrangement, and the second electrode 32 passes through the frame shape carrier plate 10 to push up the to-be-processed object 1 in the vertical direction.

In the embodiment, when the second electrode 32 is at the electrically disconnected position P1, the radio frequency power source will not be activated to provide the first electrode 31 and the second electrode 32 with the radio frequency energy. When the second electrode 32 is at the electrically conducted position P2, the radio frequency power source is activated for generating the plasma between the first electrode 31 and the second electrode 32, so as to carry out the plasma process on the to-be-processed object 1.

The moving device 33 comprises a driving member 331 and a moving member 332 linked with the driving member 331. The moving member 332 is moved along with the operation of the driving member 331 to carry the second electrode 32 to move. The driving member 331 is able to drive the moving member 332 to move toward the first electrode 31, such that the second electrode 32 passes through the frame shape carrier plate 10 to reach the electrically conducted position P2. In the embodiment, the driving member 331 is allowed to be a pneumatic cylinder or a hydraulic cylinder.

For further illustration, referring to FIG. 3 and FIG. 4, in the embodiment, the processing chamber r 30 further comprises a platform 37, and the moving device 33 further comprises a connecting plate 334. Therein, the platform 37 is fixed, and the driving member 331 raises the connecting plate 334 to carry the moving device 33 to vertically move upward, whereby the second electrode 32 passes through the frame shape carrier plate 10 to push up the to-be-processed object 1.

In the embodiment, the moving device 33 further comprises an elastic conductive member 333 disposed on one side of the moving member 332 connected with the second electrode 32 and arranged in positional alignment with the frame shape carrier plate 10, as shown by FIG. 4. When the second electrode 32 is at the electrically conducted position P2, the elastic conductive member 333 simultaneously contacts the bottom of the frame shape carrier plate 10. In the embodiment, the elastic conductive member 333 is formed of a beryllium copper.

Figure 5:
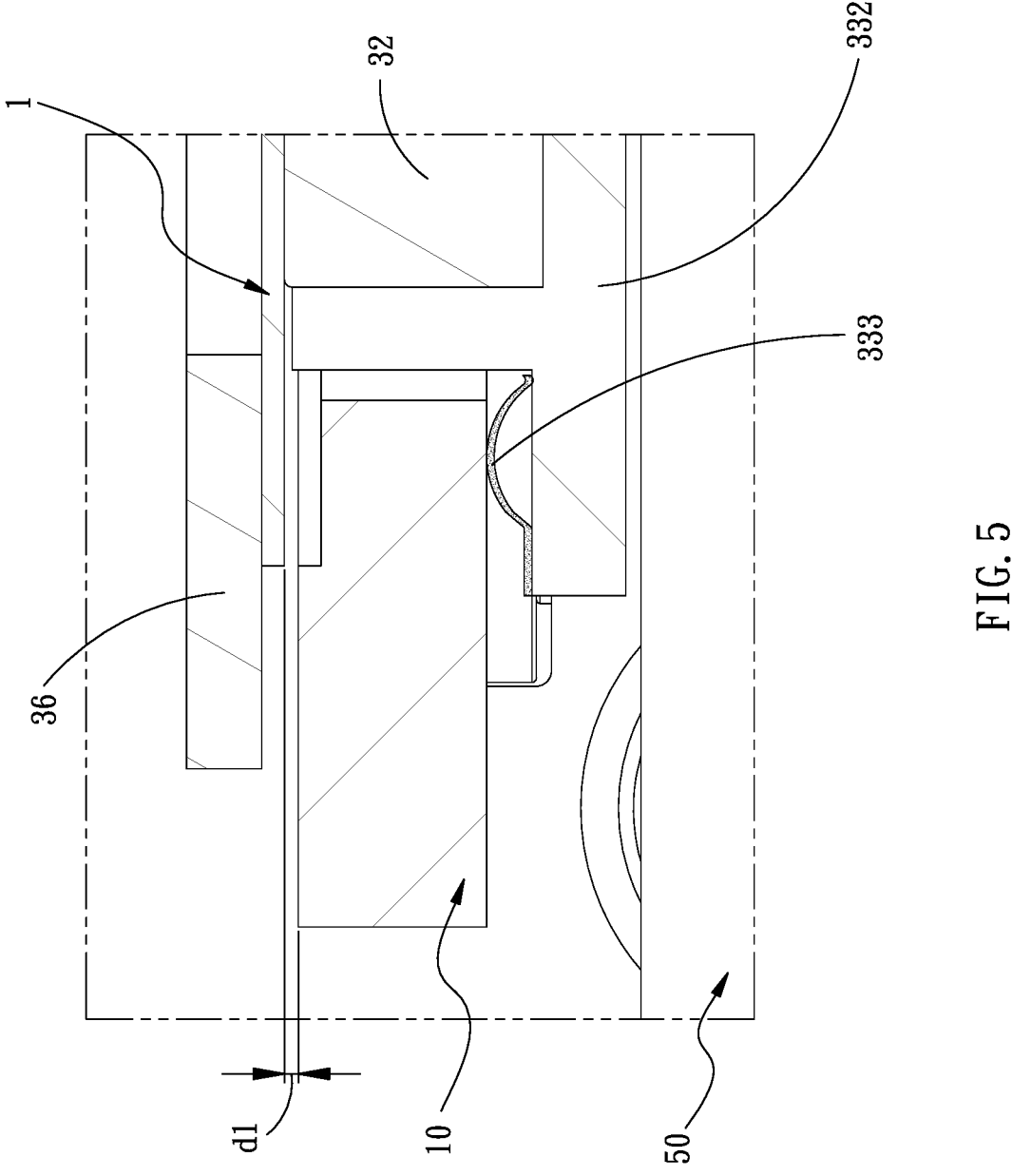
FIG. 5 is a partially enlarged view of FIG. 4, illustrating the interval distance between the to-be-processed object and the frame shape carrier plate.

In the embodiment, referring to FIG. 4 and FIG. 5, when the second electrode 32 is at the electrically conducted position P2, an interval distance d1 is formed between the to-be-processed object 1 and the frame shape carrier plate 10. In the embodiment, the interval distance d1 ranges from 1 to 3 millimeters.

Therein, the moving member 332 provides the elastic conductive member 333 with a grounding path. When the elastic conductive member 333 contacts the frame shape carrier plate 10, the frame shape carrier plate 10 is grounded through the grounding path. The frame shape carrier plate 10 in the grounding status is able to more effectively refrain the range of the plasma, thereby preventing the dispersion of plasma. Also, when the plasma process is carried out on the to-be-processed object 1, the interval distance d1 between the to-be-processed object 1 and the frame shape carrier plate 10 prevents the particles generated by the plasma process from being formed between the frame shape carrier plate 10 and the to-be-processed object 1, avoiding the occurrence of electrical conductivity between the frame shape carrier plate 10 and the to-be-processed object 1.

The processing chamber 30 comprises a horizontal adjusting module 34, a distance adjusting module 35, and a clamping device 36. Therein, the horizontal adjusting module 34 is disposed between the driving member 331 and the moving member 332, the distance adjusting module 35 is disposed on two sides of one end of the moving member 332 away from the second electrode 32, and the clamping device 36 is fixed in the processing space S.

The horizontal adjusting module 34 is configured to adjust the horizontal level of the second electrode 32 to assure the horizontal accuracy of the processing machine. In the embodiment, one end of the moving member 332 is connected with the connecting plate 334 through the horizontal adjusting module 34, and the other end passes through the platform 37 to contact the second electrode 32 in a manner of surface contact, such that the connecting plate 334 is driven by the operation of the driving member 331 to move, so as to carry the moving member 332 and the second electrode 32 to move.

Figure 6A:
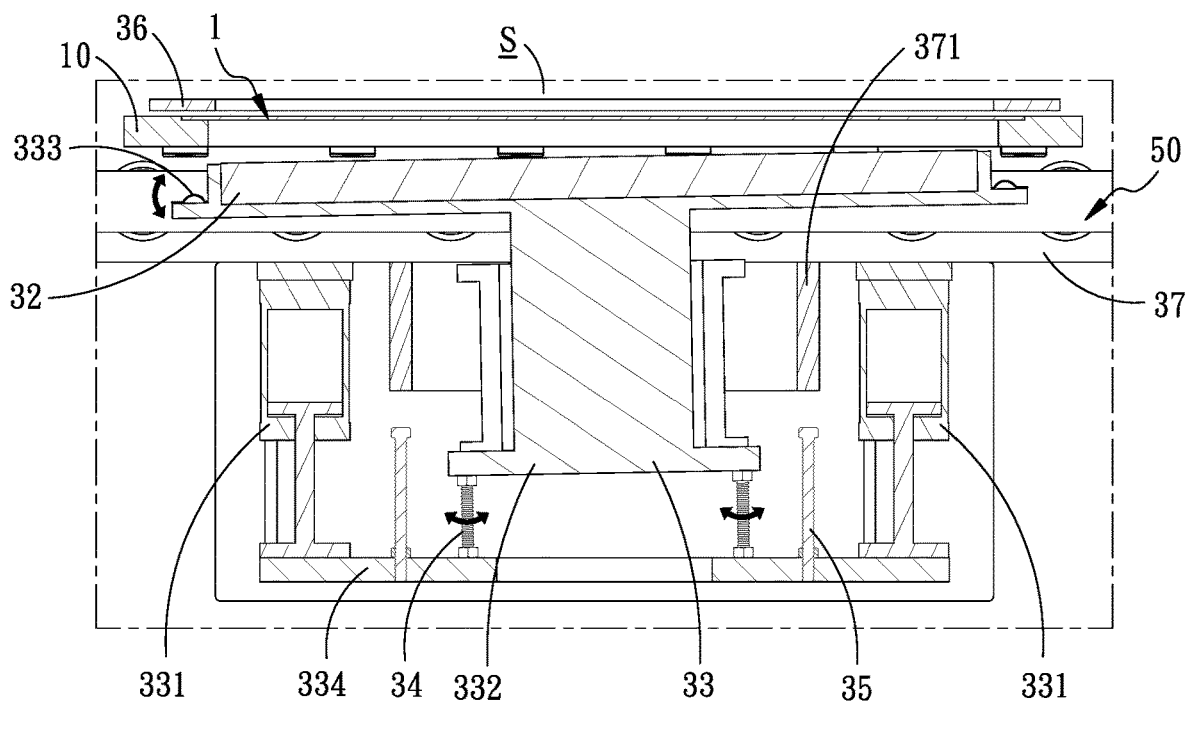
FIG. 6a to FIG. 6b are partially enlarged views of FIG. 2, illustrating the horizontal adjusting module adjusting the horizontal level of the second electrode.
Figure 6B:
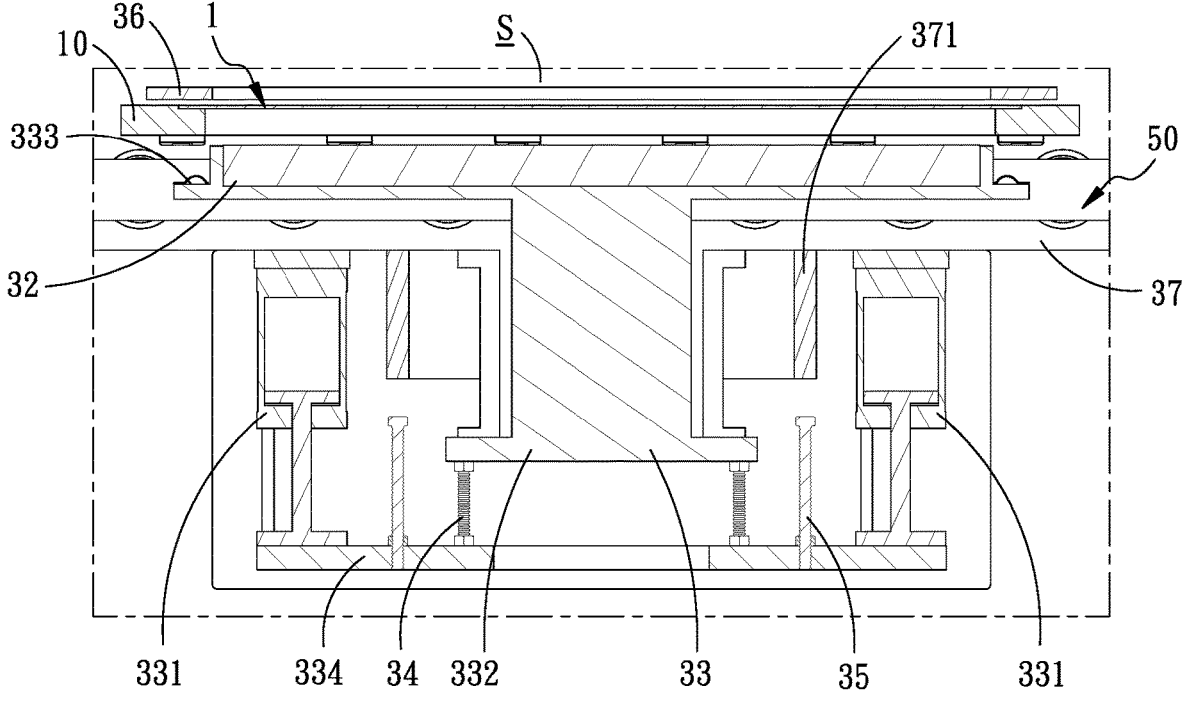

Referring to FIG. 6a to FIG. 6b, the length of the horizontal adjusting module 34 is adjustable for changing the vertical distance between the connecting plate 334 and the moving member 332, thereby calibrating the horizontal level of the second electrode 32. In the embodiment, the horizontal adjusting module 34 comprises a screw and a nut.

Other than the method above, which applies the horizontal adjusting module 34 to adjust the vertical distance between the connecting plate 334 and the moving member 332, in other possible embodiments (not shown), the driving member 331 is allowed to directly abut against the horizontal adjusting module 34, wherein one end of the moving member 332 is connected with the horizontal adjusting module 34, and the other end contacts the second electrode 32 in a manner of surface contact. Accordingly, the length of the horizontal adjusting module 34 is adjusted to change the vertical distance between the driving member 331 and the moving member 332, thereby calibrating the horizontal level of the second electrode 32.

The distance adjusting module 35 is applied for cooperating the frame shape carrier plate 10 of different sizes and models or the to-be-processed object 1 of different sizes, so as to limit the moving distance of the second electrode 32 toward the first electrode 31. In the embodiment, the platform 37 comprises a position limiting part 371. The distance adjusting module 35 is disposed on the connecting plate 334 and arranged in positional alignment with the position limiting part 371. When the moving device 33 carries the second electrode 32 to move toward the first electrode 31, as shown by FIG. 4, the position limiting part 371 abuts against the distance adjusting module 35 to limit the moving distance of the moving device 33 toward the first electrode 31, wherein the length of the distance adjusting module 35 is adjusted to change the said moving distance. In the embodiment, the distance adjusting module 35 comprises a screw and a nut.

The clamping device 36 is configured to fix the outer edge of the to-be-processed object 1, so as to prevent the to-be-processed object 1 from bending when heated during the plasma process. As shown by FIG. 4, when the moving device 33 controls the second electrode 32 to carry the to-be-processed object 1 to move toward the first electrode 31 to leave the frame shape carrier plate 10, and the second electrode 31 is at the electrically conducted position P2, the second electrode 32 and the clamping device 36 clamp the to-be-processed object 1 from two vertical sides of the to-be-processed object 1, thereby fixing the to-be-processed object 1. According, to-be-processed object 1 is prevented from hot bending, which might affect the coating effect.

In the embodiment, after the plasma process is complete, the moving device 33 controls the second electrode 32 to move away from the first electrode 31, such that the finished to-be-processed object 1 is held by the frame shape carrier plate 10, and the second electrode 32 is at the electrically disconnected position P1. Finally, the finished to-be-processed object 1 is conveyed by the conveying device 50 toward the unloading chamber 40.

With the foregoing configuration, the present invention achieves following effects.

The moving device 33 controls the second electrode 32 to push up the to-be-processed object 1, so as to generate the interval distance d1 between the frame shape carrier plate 10 and the to-be-processed object 1, preventing the occurrence of electrical conductivity between the frame shape carrier 10 and the to-be-processed object 1, thereby avoiding the reduction of processing efficiency, damage of the machine, and poor yield.

When the second electrode 32 is at the electrically conducted position P2, the elastic conductive member 333 simultaneously contacts the bottom of the frame shape carrier plate 10 to form a grounding path. Thus, during the plasma process, the frame shape carrier plate 10 is grounded for focusing the plasma agglomeration at the position of the to-be-processed object 1, preventing the particles generated by the plasma process from causing the electrical conductivity between the frame shape carrier plate 10 and the to-be-processed object 1, avoiding the damage of the machine, also avoiding the dispersion of plasma agglomeration during etching which might cause the reduction of process efficiency and the poor yield.

With the configuration of the frame shape carrier plate 10, the second electrode 32, and the moving device 33, the frame shape carrier plate 10 is simply applied for holding the to-be-processed object 1, without complicated electrode components thereon. Therefore, the present invention reduces the cost of the frame shape carrier plate 10, and also reduces the replacement cost when the frame shape carrier plate 10 is accidentally damaged or contaminated by the particles generated by the plasma process.

By changing the vertical distance between the connecting plate 334 and the moving member 332 through the horizontal adjusting module 34, the horizontal level of the second electrode 32 is calibrated, assuring the overall accuracy of the processing machine.

By limiting the moving distance of the second electrode 32 toward the first electrode 31 through the distance adjusting module 35, the present invention is adaptable to the frame shape carrier plate 10 of different sizes and models or the to-be-processed object 1 of different sizes.

By using the clamping device 36 and the second electrode 32 to fix the to-be-processed object 1, the present invention effectively clamps and fixes the to-be-processed object 1, preventing the hot bending of the to-be-processed object 1 from occurring to affect the coating effect.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A continuous plasma processing system with adjustable electrode, comprising:
   a frame shape carrier plate configured to hold a to-be-processed object;
   a loading chamber configured to input the to-be-processed object;
   a processing chamber in communication with the loading chamber and configured to receive the to-be-processed object and carry out a plasma process on the to-be-processed object, the processing chamber comprising a first electrode, a second electrode, and a moving device, the first electrode and the second electrode disposed on two opposite ends in the processing chamber to form a processing space, the moving device connected with the second electrode; when the frame shape carrier plate moves to the processing space, the moving device controls the second electrode to move between an electrically disconnected position and an electrically conducted position; when the second electrode is away from the first electrode and does not contact the to-be-processed object, the second electrode is at the electrically disconnected position; when the second electrode moves toward the first electrode and passes through the frame shape carrier plate to push up the to-be-processed object to leave the frame shape carrier plate, the second electrode is at the electrically conducted position; and
   an unloading chamber in communication with the processing chamber and configured to receive and output the finished to-be-processed object.

2. The continuous plasma processing system of claim 1, wherein the first electrode and the second electrode are disposed in a vertical arrangement in the processing chamber; the continuous plasma processing system further comprises a conveying device configured to facilitate a horizontal movement of the frame shape carrier plate in the processing chamber.

3. The continuous plasma processing system of claim 1, wherein the moving device comprises a driving member and a moving member; the moving member is moved along with an operation of the driving member to drive the second electrode to move.

4. The continuous plasma processing system of claim 3, wherein the processing chamber comprises a platform; the moving device further comprises a connecting plate; the driving member has one end thereof connected with the platform and another end thereof abutting against the connecting plate; the moving member has one end thereof connected with the connecting plate and another end thereof passing through the platform to contact the second electrode in a manner of surface contact; the connecting plate is moved along with the operation of the driving member to drive the moving member and the second electrode to move.

5. The continuous plasma processing system of claim 4, wherein a horizontal adjusting module is disposed between the driving member and the moving member; the moving member has one end thereof connected with the connecting plate through the horizontal adjusting module and the other end thereof contacting the second electrode in a manner of surface contact; the horizontal adjusting module changes a vertical distance between the connecting plate and the moving member to adjust a horizontal level of the second electrode.

6. The continuous plasma processing system of claim 5, wherein the platform comprises a position limiting part; a distance adjusting module is disposed on the connecting plate and arranged in positional alignment with the position limiting part; the position limiting part abuts against the distance adjusting module to limit a moving distance of the moving device toward the first electrode, and the distance adjusting module is configured to adjust the moving distance.

7. The continuous plasma processing system of claim 3, wherein an elastic conductive member is disposed on one side of the moving device connected with the second electrode and arranged in positional alignment with the frame shape carrier plate; when the second electrode is at the electrically conducted position, the elastic conductive member contacts the frame shape carrier plate.

8. The continuous plasma processing system of claim 1, wherein when the second electrode is at the electrically conducted position, an interval distance is formed between the to-be-processed object and the frame shape carrier plate.

9. The continuous plasma processing system of claim 8, wherein the interval distance ranges from 1 to 3 millimeters.

10. The continuous plasma processing system of claim 1, wherein the processing chamber comprises a clamping device fixed in the processing space and configured to fix the to-be-processed object.

11. The continuous plasma processing system of claim 10, wherein when the second electrode is at the electrically conducted position, the second electrode and the clamping device clamp and fix the to-be-processed object from two sides thereof.

* * * * *